United States Patent
Luo et al.

(10) Patent No.: US 10,602,651 B2
(45) Date of Patent: Mar. 24, 2020

(54) SYSTEM FOR TRACING PRINTED CIRCUIT BOARDS THROUGH MANUFACTURING STAGES

(71) Applicants: Avary Holding (Shenzhen) Co., Limited., Shenzhen (CN); HongQiSheng Precision Electronics (QinHuangDao) Co., Ltd., Qinhuangdao (CN)

(72) Inventors: Fu-Sheng Luo, Shenzhen (CN); Pai-Hung Huang, New Taipei (TW); Chien-Jui Lo, New Taipei (TW); Yin-Zhen Zeng, Shenzhen (CN)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 56 days.

(21) Appl. No.: 16/051,045

(22) Filed: Jul. 31, 2018

(65) Prior Publication Data

US 2019/0320565 A1 Oct. 17, 2019

(30) Foreign Application Priority Data

Apr. 17, 2018 (CN) .......................... 2018 1 0343537

(51) Int. Cl.
*H05K 13/08* (2006.01)
*H05K 3/46* (2006.01)
*H05K 1/02* (2006.01)

(52) U.S. Cl.
CPC ......... *H05K 13/082* (2018.08); *H05K 1/0268* (2013.01); *H05K 1/0269* (2013.01);
(Continued)

(58) Field of Classification Search
CPC .. H05K 13/082; H05K 13/084; H05K 13/087; H05K 1/0268; H05K 1/0269; H05K 3/4644; H05K 1/0266
See application file for complete search history.

(56) References Cited

U.S. PATENT DOCUMENTS 6,091,026 A * 7/2000 Yang .................... H05K 3/4638
174/250
6,114,634 A * 9/2000 Dittmer ................ H05K 3/4638
174/250

(Continued)

*Primary Examiner* — Steven T Sawyer
(74) *Attorney, Agent, or Firm* — ScienBiziP, P.C.

(57) ABSTRACT

A system for tracking objects such as a printed circuit board (PCB) undergoing multiple manufacturing processes traceability system includes a coding unit, a scanning unit, and a reading unit and a database. The printed circuit board includes at least two inner copper foil substrates, subsequent substrates can be added. The coding unit marks identification and manufacturing stage codes on the inner copper foil substrate for through scanning by the scanning unit emitting X-rays. The reading unit can receive and parse the codes identified by the X-rays, and determine the previous or a next stage according to a predetermined encoding rule without risk of stage repetition or stage omission or product misplacement. The database stores standard identities and information as to manufacturing stages as a reference.

20 Claims, 8 Drawing Sheets

(52) U.S. Cl.
CPC ......... *H05K 3/4644* (2013.01); *H05K 13/084* (2018.08); *H05K 13/087* (2018.08)

(56) References Cited

U.S. PATENT DOCUMENTS

| | | | | |
|---|---|---|---|---|
| 6,232,559 | B1* | 5/2001 | Janecek | H05K 3/4638 174/250 |
| 2001/0026638 | A1* | 10/2001 | Sangu | G03F 9/00 382/151 |
| 2003/0192182 | A1* | 10/2003 | Hiramatsu | H05K 3/0008 29/852 |
| 2010/0194855 | A1* | 8/2010 | Mamiya | G01B 11/25 348/42 |
| 2016/0037637 | A1* | 2/2016 | Carlson | H05K 1/115 174/266 |

* cited by examiner

SYSTEM FOR TRACING PRINTED CIRCUIT BOARDS THROUGH MANUFACTURING STAGES

FIELD

The subject matter herein generally relates to tracking of objects during manufacturing processes.

BACKGROUND

Identification codes such as characters, one-dimensional codes, or two-dimensional codes on printed circuit boards can identify the printed circuit board in production. However, the printed circuit board generally refers to multi-customer, multi-spec, multi-number, multi-batch production, and tracking such printed circuit board during the production can be confused.

Therefore, there is room for improvement within the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIGS. 1 to 10, a method for making a printed circuit board 100 is presented in accordance with an embodiment. The method for making the FPCB 100 is provided by way of example, as there are a variety of ways to carry out the method. The method can begin at step 1.

Figure 1:
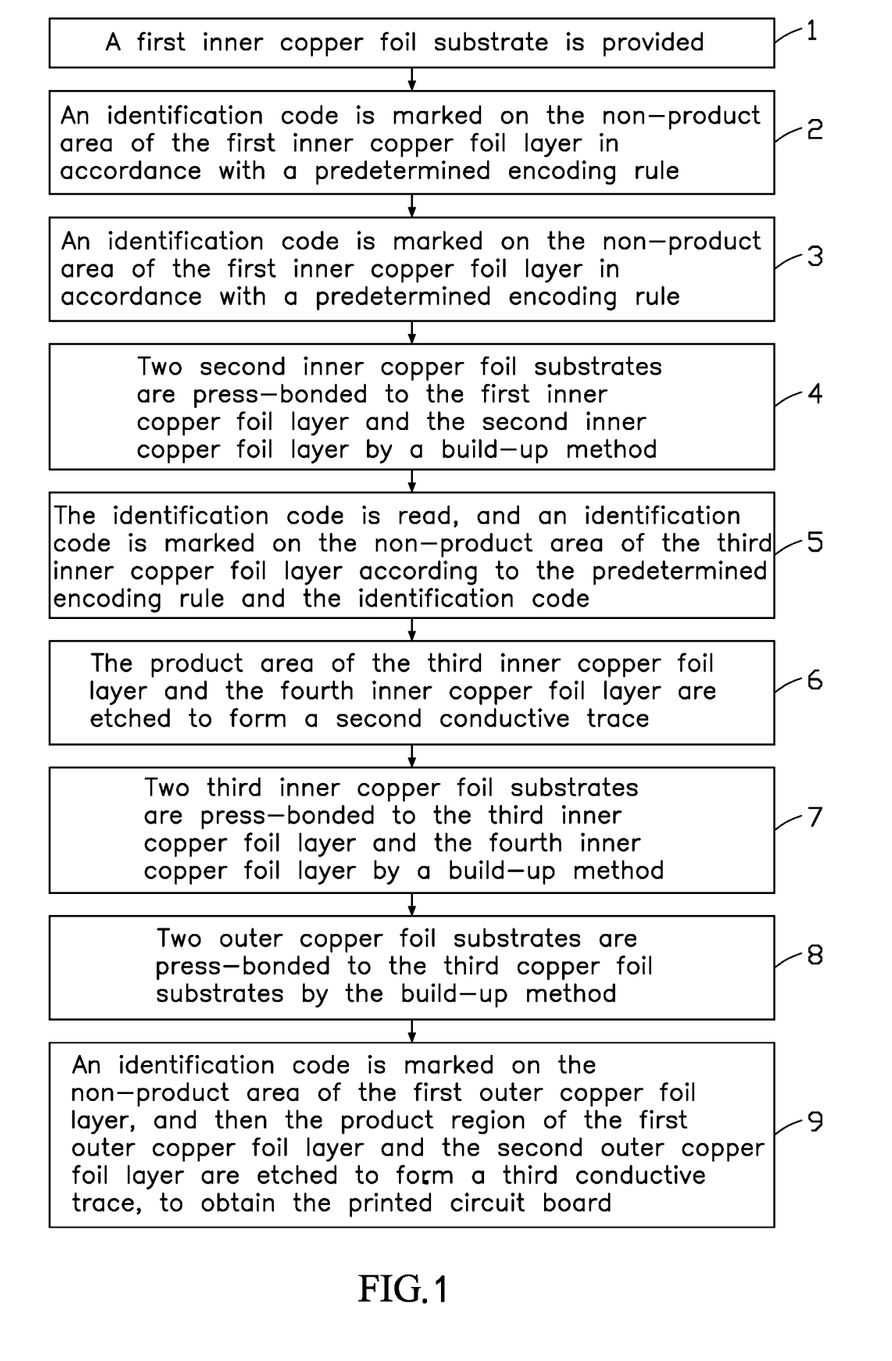
FIG. 1 is a flowchart of an exemplary embodiment of a method for making a printed circuit board.
Figure 2:
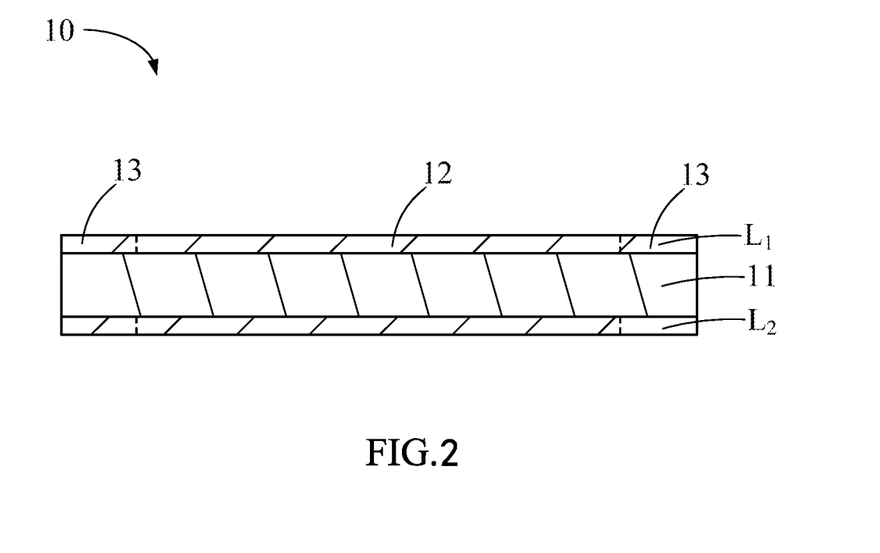
FIG. 2 is a diagram of an embodiment of a first inner copper foil substrate.

At step 1, referring to FIGS. 1 and 2, a first inner copper foil substrate 10 is provided. The first inner copper foil substrate 10 includes an insulating base layer 11 and a first inner copper foil layer L1 and a second inner copper foil layer L2 formed on opposite surfaces of the base layer 11. The first inner copper foil layer L1 and the second inner copper foil layer L2 each include at least one product area 12 and a non-product area 13 disposed around the product area 12.

In at least one embodiment, the base layer 11 is made of polypropylene, polyimide, liquid crystal polymer, polyethylene terephthalate or polyethylene naphthalate.

Figure 3:
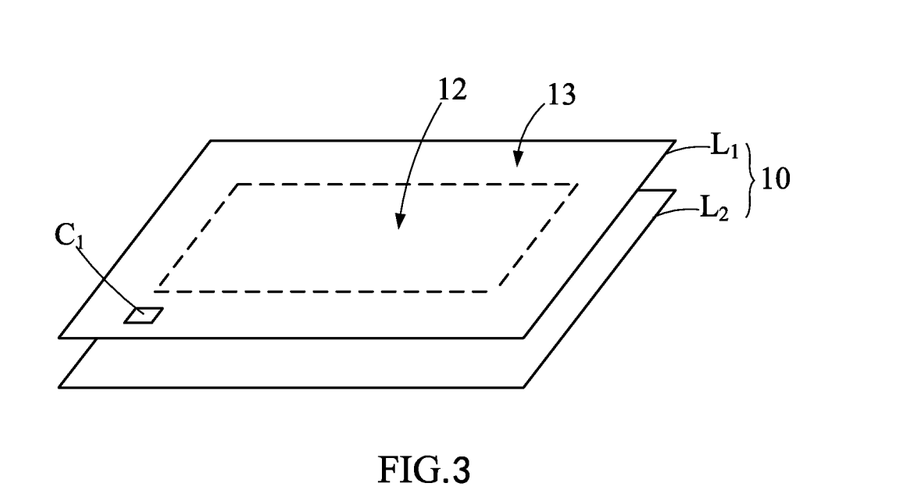
FIG. 3 is a diagram showing an identification code marked on the first inner copper foil layer of FIG. 2.

At step 2, referring to FIGS. 1 and 3, an identification code C1 is marked on the non-product area 13 of the first inner copper foil layer L1 in accordance with a predetermined encoding rule. A predetermined encoding rule is that each identification code C1 records identity information of the inner copper foil substrate of a corresponding layer and each identification code C1 is associated with an identification code of the inner copper foil substrate of previous layer. That is, the identification code C1 records the identity information of the first inner copper foil substrate 10.

Figure 4:
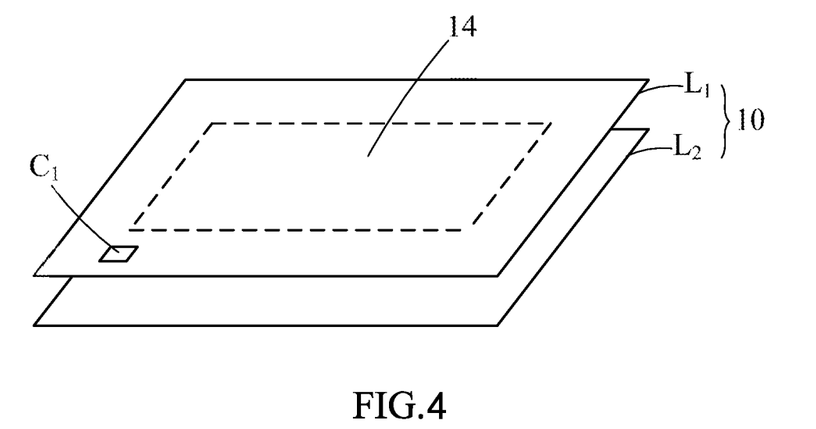
FIG. 4 is a diagram showing the first inner copper foil layer of FIG. 3 etched to form a first conductive trace.

At step 3, referring to FIGS. 1 and 4, the product area 12 of first inner copper foil layer L1 and the second inner copper foil layer L2 are etched to form a first conductive trace 14. Further, the identity information recorded by the identification code C1 and processing information of the first inner copper foil substrate 10 are output to a database 220 (shown in FIG. 10) for storage. The processing information may include, but is not limited to, production process parameters and production equipment parameters. A time marker is stored in the database 220. The identity information recorded by the identification code C1 and the processing information of the first inner copper foil substrate 10 are stored on time node according to processing time of the first inner copper foil substrate 10.

In at least one embodiment, the first conductive trace 14 is formed by an exposure process.

Figure 5:
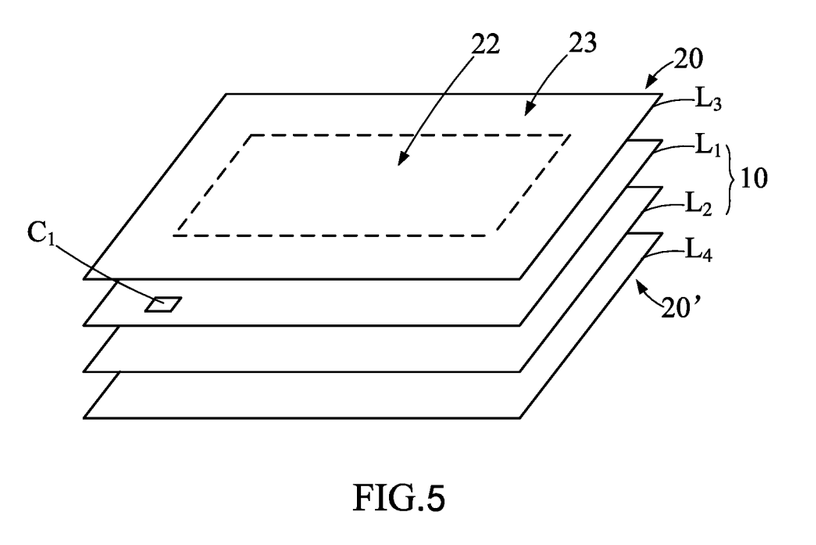
FIG. 5 is a diagram showing second inner copper foil substrates press-bonded to the first inner copper foil layer of FIG. 4.

At step 4, referring to FIGS. 1 and 5, two second inner copper foil substrates 20, 20' are press-bonded to the first inner copper foil layer L1 and the second inner copper foil layer L2 by a build-up method. The second inner copper foil substrate 20 includes a glue layer (not shown) and a third inner copper foil layer L3. The second inner copper foil substrate 20' includes a glue layer (not shown) and a fourth inner copper foil layer L4. The third inner copper foil layer L3 and the fourth inner copper foil layer L4 also each include at least one product area 22 and a non-product area 23 disposed around the product area 22. The product area 22 and the non-product area 23 respectively correspond to the product area 12 and the non-product area 13 along the Z axis.

In at least one embodiment, the glue layer 11 is made of viscous resin selected from a group consisting of polypropylene, epoxy resin, polyurethane, phenolic resin, urea-formaldehyde resin, melamine-formaldehyde resin, and polyimide.

Figure 6:
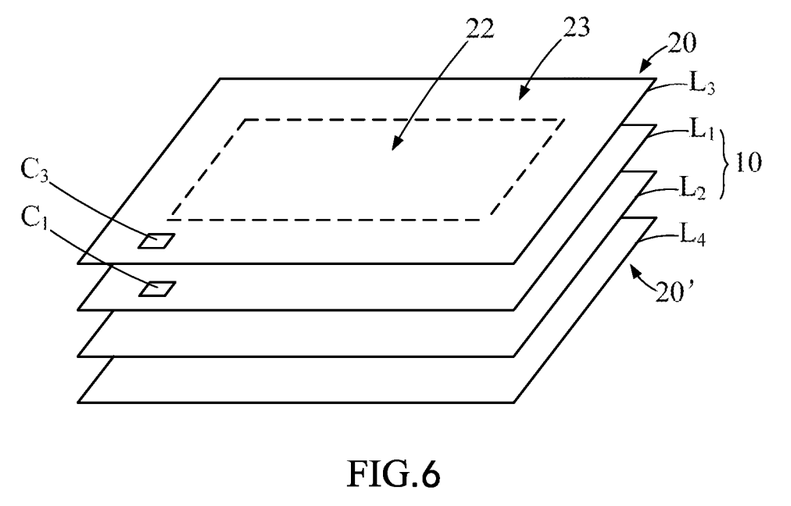
FIG. 6 is a diagram showing an identification code marked on the second inner copper foil of FIG. 5.

At step 5, referring to FIGS. 1 and 6, the identification code C1 is read, and an identification code C3 is marked on the non-product area 13 of the third inner copper foil layer L3 according to the predetermined encoding rule and the identification code C1. The identification code C3 records the identity information of the second inner copper foil substrate 20, and the identification code C3 is associated with the identification code C1.

After the second inner copper foil substrate 20 is pressed by the build-up method, the identification code C1 is covered and obscured. Thus, the identification code C1 is scanned by X-rays. The identification code C1 is read and analyzed.

Figure 7:
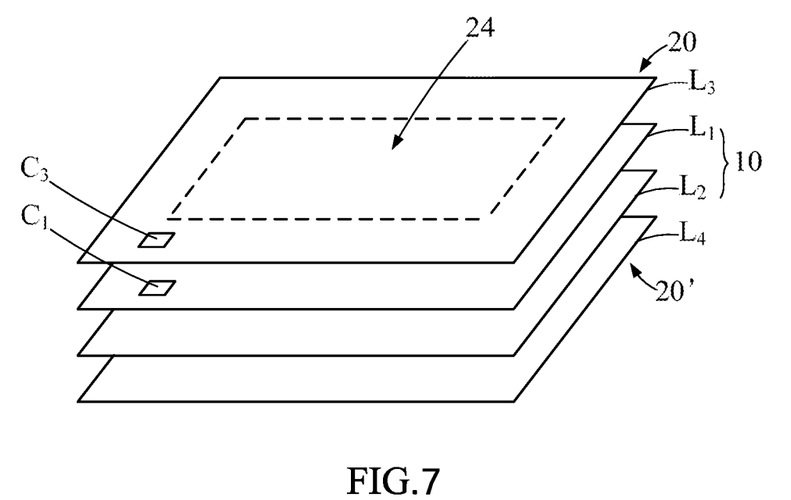
FIG. 7 is a diagram showing the second inner copper foil substrate of FIG. 6 etched to form a second conductive trace.

At step 6, referring to FIGS. 1 and 7, the product area 22 of the third inner copper foil layer L3 and the fourth inner copper foil layer L4 are etched to form a second conductive trace 24. Further, the identity information recorded by the identification code C3 and the processing information of the second inner copper foil substrate 20, 20' are output to the database 220, and are stored on the time node according to processing time of the second inner copper foil substrate 20, 20'.

In at least one embodiment, before forming the second conductive trace 24, the second inner copper foil substrates 20, 20' are subjected to interlayer conduction processing (i.e., drilling or plating to form via holes).

Figure 8:
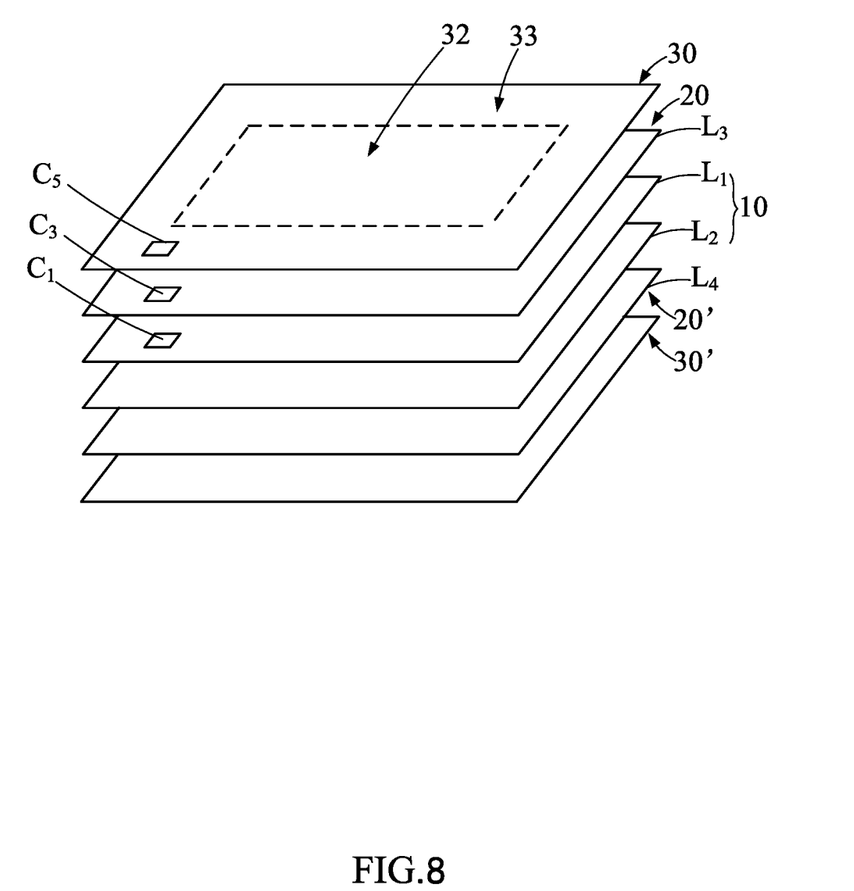
FIG. 8 is a diagram showing third inner copper foil substrates press-bonded to the second inner copper foil substrate of FIG. 7.

At step 7, referring to FIGS. 1 and 8, two third inner copper foil substrates 30, 30' are press-bonded to the third inner copper foil layer L3 and the fourth inner copper foil layer L4 by a build-up method. The third inner copper foil substrates 30, 30' each include at least one product area 32 and a non-product area 33 disposed around the product area 32. The product area 32 and the non-product area 33 respectively correspond to the product area 22 and the non-product area 23 of the second copper foil substrate 20, 20' in the Z axis.

After adding one inner copper foil substrate each time, reading the identification code of the previous copper foil substrate, and according to the predetermining coding rule and the identification code of the previous inner copper foil substrate, the identification code (such as the identification code C5 shown in FIG. 7) is marked on the newly added inner copper foil substrate. Further, after adding a fresh inner copper foil substrate each time, the identity information and the processing information recorded by the identification code of the inner copper foil substrate are output to the database 220 for storage.

In at least one embodiment, before forming conductive trace, the third inner copper foil substrates 30, 30' are subjected to interlayer conduction processing.

The number of the third inner copper foil substrates 30, 30' described in the step 7 can be set according to requirements. In another embodiment, step 7 can also be omitted.

Figure 9:
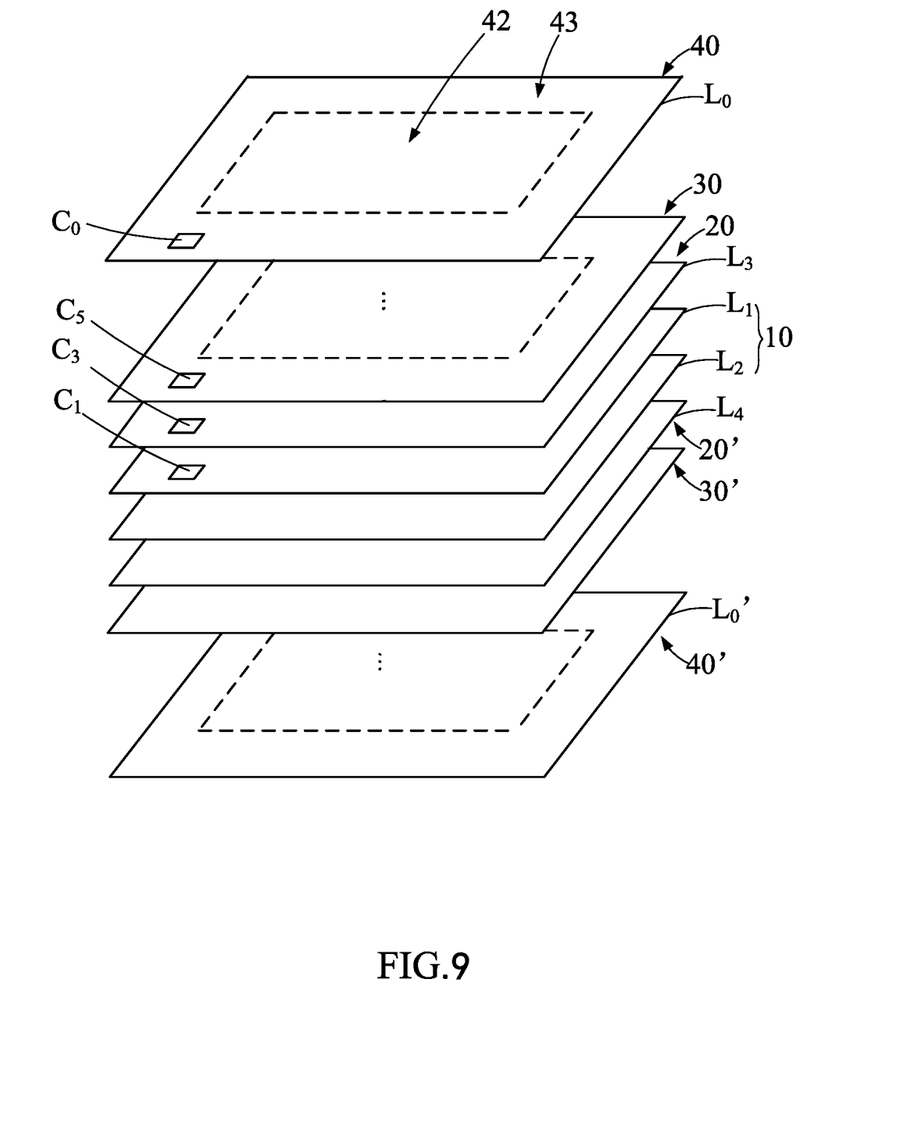
FIG. 9 is a diagram showing outer copper foil substrates press-bonded to the third copper foil substrates of FIG. 8.

At step 8, referring to FIGS. 1 and 9, two outer copper foil substrates 40, 40' are press-bonded to the third copper foil substrates 30, 30' by the build-up method. The outer copper foil substrate 40 includes a glue layer (not shown) and a first outer copper foil layer L0. The outer copper foil substrate 40' includes a glue layer (not shown) and a second outer copper foil layer L0'. The first outer copper foil layer L0 and the second outer copper foil layer L0' also each include at least one product area 42 and a non-product area 43 disposed around the product area 42. The product area 42 and the non-product area 43 correspond to the product area 32 and the non-product area 33 of the third copper foil substrate 30, 30' in the Z axis.

Figure 10:
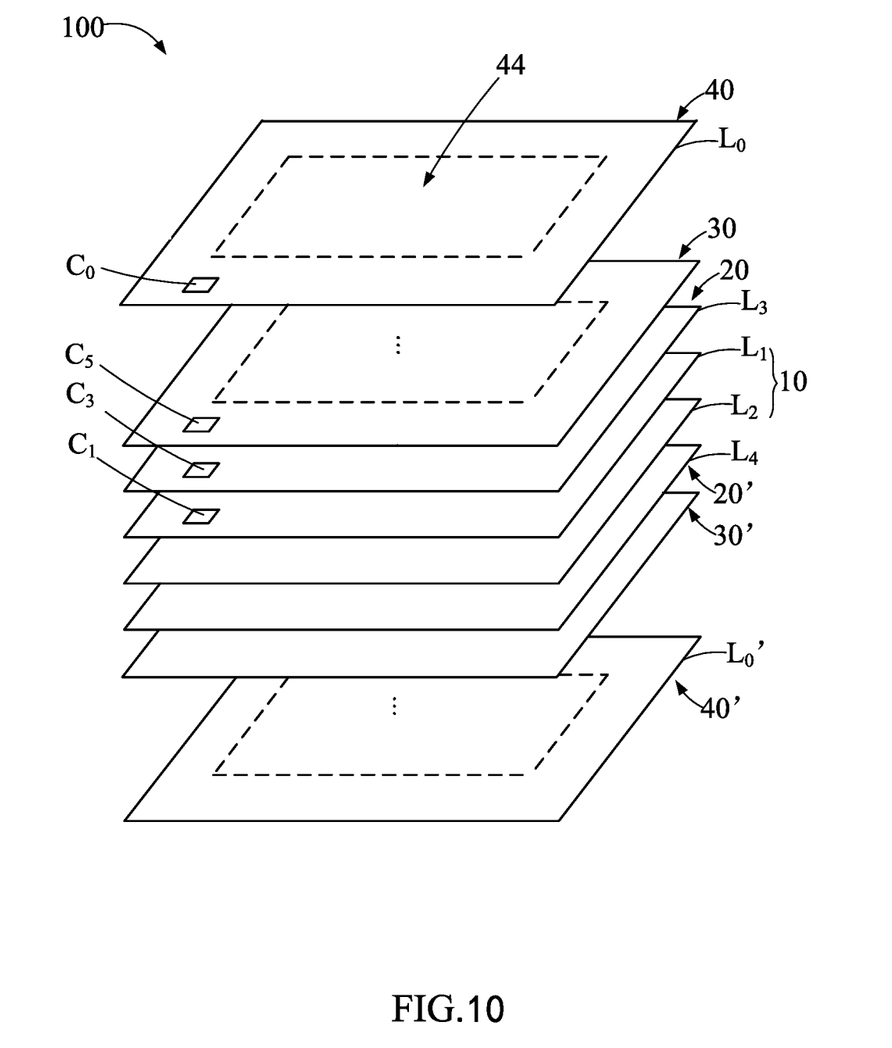
FIG. 10 is an isometric view of the printed circuit board after the outer copper foil substrates of FIG. 9 marked with an identification code and etched.

At step 9, referring to FIGS. 1 and 10, an identification code C0 is marked on the non-product area 43 of the first outer copper foil layer L0, and then the product region 42 of the first outer copper foil layer L0 and the second outer copper foil layer L0' are etched to form a third conductive trace 44, to obtain the printed circuit board 100. Further, the identification code C0 and processing information of the outer copper foil substrate 40, 40' are output to the database 220, and are stored on the time node according to processing time of the outer copper foil substrate 40, 40'.

In at least one embodiment, before forming the third conductive trace 44, the first outer copper foil layer L0 and the second outer copper foil layer L0' are subjected to interlayer conduction processing. After forming the third conductive trace 44, the first outer copper foil layer L0 and the second outer copper foil layer L0' are subjected to solder resist treatment.

It can be understood that when the copper foil substrate includes a number of product areas, after the printed circuit board 100 is obtained, a plurality of printed circuit board units corresponding to the product areas are formed on the printed circuit board 100. At this time, the printed circuit board 100 is further subjected to a molding process to obtain separate printed circuit board units.

In another embodiment, the identification code on the first inner copper foil substrate 10 can be omitted. For example, the identification code can be marked from the second inner copper foil substrate 20. The identification code can also be marked to start from the inner copper foil substrate of any of the other layers.

Figure 11:
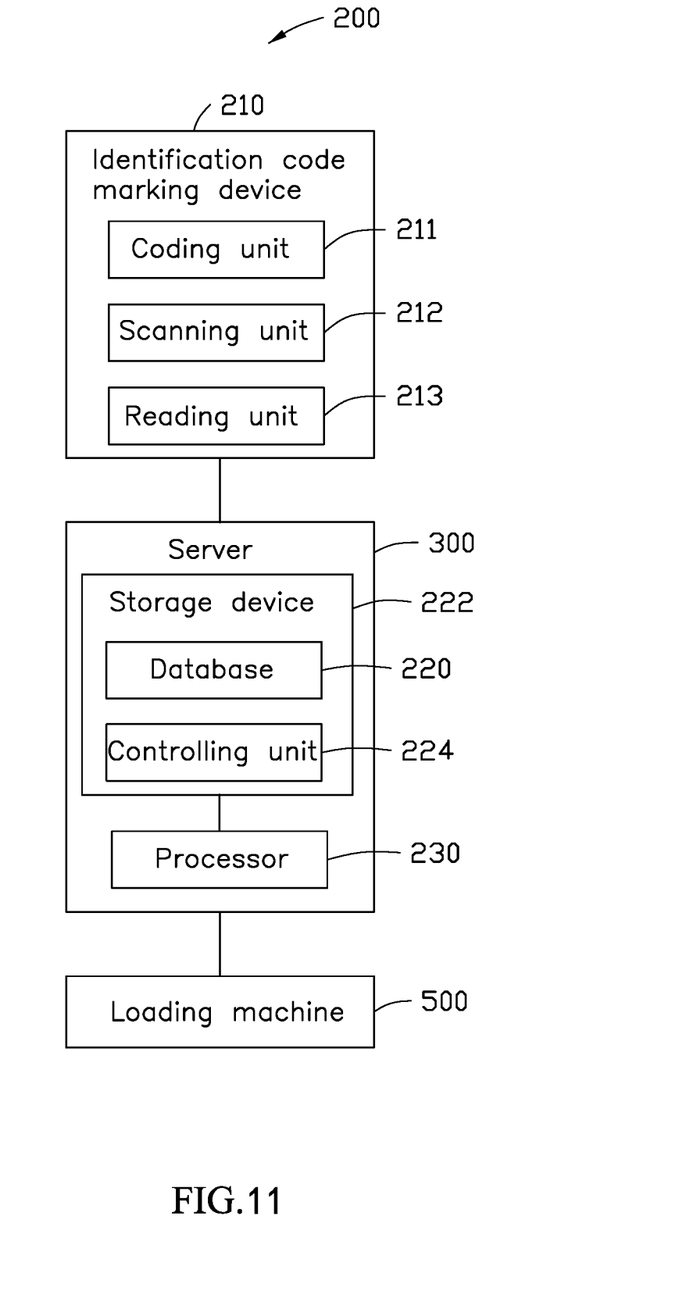
FIG. 11 is a diagram of a tracing system according to an embodiment.

FIG. 11 illustrates a traceability system 200. The traceability system 200 is applied to the method of manufacturing the printed circuit board 100 described above, and is configured to trace identity and manufacturing stages of each printed circuit board 100.

The traceability system 200 includes an identification code marking device 210 and a server 300 communicating with the identification code marking device 210. The server 300 includes a storage device 222 and a processor 230. The storage device 222 stores program codes of a controlling unit 224 and a database 220 for the processor 230.

The identification code marking device 210 includes a coding unit 211, a scanning unit 212, and a reading unit 213. The scanning unit 212 is electrically connected to the coding unit 211, and the reading unit 213 is electrically connected to the scanning unit 212.

The coding unit 211 is configured to mark the identification code C1 on the first inner copper foil substrate 10 according to the predetermined coding rule. The predetermined encoding rule records the identity information of the inner copper foil substrate of the corresponding layer for each identification code for traceability, and each identification code is associated with the identification code of the inner copper foil substrate of the previous layer. That is, the identification code C1 records the identity information of the first inner copper foil substrate 10.

In at least one embodiment, the coding unit 211 is a laser marking device. That is, the identification code is marked by a laser marking technique, that is, the first inner copper foil substrate 10 is irradiated with a high energy density laser to melt the surface material to form a pattern, thereby forming the identification code C1. More specifically, the identification code C1 may be a two-dimensional code graphic. A size of the identification code C1 can be set according to a size of the non-product area 13. The form of the identification code C1 is not limited to the two-dimensional code graphic, and also can be numbers, characters, letters or a combination of numbers, characters, or letters.

The scanning unit 2122 is configured to emit X-rays which pass through the second inner copper foil substrate 20 to scan the identification code C1 of the first inner copper foil 10 and a first identification code graphic is generated. The scanning unit 212 is further configured to emit X-rays after adding one of the third inner copper foil substrates 30 each time, so that the X-rays pass through the newly added third inner copper foil substrate 20 to scan the identification code of the inner copper foil substrate of the previous layer, and generates a second identification code graphic.

The reading unit 213 is configured to receive and parse the identification code graphic, and determine a next identification code according to the encoding rule and the parsed identification code graphic. In the embodiment, the reading unit 213 is a visual recognition device such as a charge-coupled device.

The coding unit 211 is further configured to mark the determined identification code on the newly added second inner copper foil substrate 20 or the third inner copper foil substrate 30, and finally marking the identification code C0 on the outer copper foil substrate 40.

The database 220 is configured to store the information as to processing and the identity information recorded by the identification code of the first inner copper foil substrate 10, 10', the second inner copper foil substrate 20, 20', the third inner copper foil substrate 30, 30', and the outer copper foil substrates 40, 40'.

In at least one embodiment, the server 300 is further electrically coupled to a loading machine 500. When an abnormality occurs, the controlling unit 224 controls the loading machine 500 to stop loading of the second inner copper foil substrate 20, 20', the third inner copper foil substrate 30, 30' or the outer copper foil substrates 40, 40' as the case may be. In this embodiment, the controlling unit 224 reads the identification code stored in the database 220 in real time or periodically, and determines that an abnormality occurs when the read identification code is abnormal. In another embodiment, information as to standard processing of each station is also stored in the database 220. The controlling unit 224 reads the processing information stored in the database 220 in real time or periodically, and compares the read processing information with the stored standard processing information to determine whether an abnormality occurred.

In the printed circuit board 100 prepared above, each time a copper foil substrate is added, the newly added identification code is associated with the identification code of the previous inner copper foil substrate, so that it is not necessary to query the identification code layer by layer. According to one of the identification codes, the identification code of the copper foil substrate in any other layer can be calculated, and the whole process identity series and cross-layer tracking detection can be realized. Moreover, as the process flows, the identity information recorded by the identification code of each printed circuit board 100 at each stage and the processing information of each stage are stored on the time marker of the database 220, thereby production process information of the circuit board 100 can be clearly recorded and stored.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A traceability system of a printed circuit board comprising at least two inner copper foil substrates, the traceability system comprising:
    an identification code marking device comprising:
        a coding unit configured to mark an identification code on each inner copper foil substrate;
        a scanning unit configured to emit X-rays after adding one of the inner copper foil substrates each time so that the X-rays pass through the newly added inner copper foil substrate to scan the identification code of the inner copper foil substrate of the previous layer, and generate an identification code graphic;
        a reading unit configured to receive and parse the identification code graphic, and determine a next identification code according to a predetermined encoding rule and the parsed identification code graphic, the predetermined encoding rule being that each identification code records an identity information of the inner copper foil substrate of corresponding layer, and each identification code associated with the identification code of the identification code of the inner copper foil substrate of previous layer;
        the coding unit further configured to mark determined identification code on newly added inner copper foil substrate; and
    a server communicating with the identification code marking device and comprising:
        a storage device that stores one or more programs and a database; and
        a processor;
    the one or more programs when executed by the processor, cause the processor to:
    store the identity information recorded by the identification code of the inner copper foil substrate and processing information and processing information of the inner copper foil substrate in the database.

2. The traceability system of claim 1, wherein the server further electrically coupled to a loading machine, the processor is further caused to:
    control the loading machine to stop loading the newly added inner copper foil substrate when an abnormality occurs.

3. The traceability system of claim 2, wherein the processor is further caused to:
    read the identification code stored in the database in real time; and
    determine that an abnormality occurs when read identification code is abnormal.

4. The traceability system of claim 2, wherein the processor is further caused to:
    read the identification code stored in the database periodically; and
    determine that an abnormality occurs when read identification code is abnormal.

5. The traceability system of claim 2, wherein the database further stores standard processing information of each station, and the processor is further caused to:

read the processing information in real time; and compare the processing information with the standard processing information to determine whether an abnormality is occurred.

6. The traceability system of claim 2, wherein the database further stores standard processing information of each station, and the processor is further caused to:

read the processing information periodically; and compare the processing information with the standard processing information to determine whether an abnormality is occurred.

7. The traceability system of claim 1, wherein a time axis is stored in the database, and the processor is further caused to:

store the identity information recorded by the identification code and the processing information on corresponding time node of the time axis according to processing time of the inner copper foil substrate.

8. The traceability system of claim 7, wherein the processor is further caused to:

store the corresponding processing information of the inner copper foil substrate on the time node corresponding to the time axis according to processing time of the inner copper foil substrate.

9. The traceability system of claim 1, wherein the reading unit is a visual recognition device having charge-coupled device.

10. The traceability system of claim 1, wherein the coding unit is a laser marking device.

11. A traceability system of a printed circuit board comprising at least two first inner copper foil substrates, the traceability system comprising:

an identification code marking device comprising:

a coding unit configured to mark an identification code on each inner copper foil substrate;

a scanning unit configured to emit X-rays after adding a second inner copper foil substrates so that the X-rays pass through the second inner copper foil substrate to scan the identification code of the first inner copper foil substrate, and generate an identification code graphic;

a reading unit configured to receive and parse the identification code graphic, and determine a next identification code according to a predetermined encoding rule and the parsed identification code graphic, the predetermined encoding rule being that each identification code records an identity information of the first inner copper foil substrate and the second inner copper foil substrate, and the identification code of the second inner copper foil substrate associated with the identification code of the first inner copper foil substrate;

the coding unit further configured to mark determined identification code on second inner copper foil substrate; and a server communicating with the identification code marking device and comprising:

a storage device that stores one or more programs and a database; and a processor;

the one or more programs when executed by the processor, cause the processor to:

store the identity information recorded by the identification code of the first inner copper foil substrate and the second inner copper foil substrate and processing information and processing information of the first inner copper foil substrate and the second inner copper foil substrate in the database.

12. The traceability system of claim 11, wherein the server further electrically coupled to a loading machine, the processor is further caused to:

control the loading machine to stop loading the second inner copper foil substrate when an abnormality occurs.

13. The traceability system of claim 12, wherein the processor is further caused to:

read the identification code stored in the database in real time; and determine that an abnormality occurs when read identification code is abnormal.

14. The traceability system of claim 12, wherein the processor is further caused to:

read the identification code stored in the database periodically; and determine that an abnormality occurs when read identification code is abnormal.

15. The traceability system of claim 12, wherein the database further stores standard processing information of each station, and the processor is further caused to:

read the processing information in real time; and compare the processing information with the standard processing information to determine whether an abnormality is occurred.

16. The traceability system of claim 12, wherein the database further stores standard processing information of each station, and the processor is further caused to:

read the processing information periodically; and compare the processing information with the standard processing information to determine whether an abnormality is occurred.

17. The traceability system of claim 11, wherein a time axis is stored in the database, and the processor is further caused to:

store the identity information recorded by the identification code and the processing information on corresponding time node of the time axis according to processing time of the first inner copper foil substrate and the second inner copper foil.

18. The traceability system of claim 17, wherein the processor is further caused to:

store the corresponding processing information of the second inner copper foil substrate on the time node corresponding to the time axis according to processing time of the first inner copper foil substrate and the second inner copper foil substrate.

19. The traceability system of claim 11, wherein the reading unit is a visual recognition device having charge-coupled device.

20. The traceability system of claim 11, wherein the coding unit is a laser marking device.

* * * * *